(12) United States Patent
Jaramillo

(10) Patent No.: US 10,723,422 B2
(45) Date of Patent: Jul. 28, 2020

(54) PHOTOVOLTAIC ARRAY SYSTEM AND METHOD

(71) Applicant: Elliot Jaramillo, LaVerne, CA (US)

(72) Inventor: Elliot Jaramillo, LaVerne, CA (US)

(73) Assignee: Concept Clean Energy, LLC, Laguna Beach, CA (US)

( * ) Notice: Subject to any disclaimer, the term of this patent is extended or adjusted under 35 U.S.C. 154(b) by 0 days.

(21) Appl. No.: 15/638,296

(22) Filed: Jun. 29, 2017

(65) Prior Publication Data

US 2018/0001975 A1      Jan. 4, 2018

Related U.S. Application Data

(60) Provisional application No. 62/356,056, filed on Jun. 29, 2016.

(51) Int. Cl.
| | |
|---|---|
| *B63B 35/44* | (2006.01) |
| *H02S 20/30* | (2014.01) |
| *H02S 30/10* | (2014.01) |
| *F24S 25/11* | (2018.01) |
| *F24S 25/16* | (2018.01) |
| *F24S 20/70* | (2018.01) |
| *F24S 25/67* | (2018.01) |
| *F24S 25/00* | (2018.01) |

(52) U.S. Cl.
CPC .............. *B63B 35/44* (2013.01); *F24S 20/70* (2018.05); *F24S 25/11* (2018.05); *F24S 25/16* (2018.05); *H02S 20/30* (2014.12); *H02S 30/10* (2014.12); *B63B 2035/4453* (2013.01); *F24S 25/67* (2018.05); *F24S 2025/013* (2018.05)

(58) Field of Classification Search
None
See application file for complete search history.

(56) References Cited

U.S. PATENT DOCUMENTS

2016/0006391 A1* 1/2016 Kokotov ................. H02S 20/30
                                                                        136/244
2017/0085214 A1* 3/2017 Niimi ..................... H02S 10/40

* cited by examiner

*Primary Examiner* — Devina Pillay
(74) *Attorney, Agent, or Firm* — FisherBroyles, LLP

(57) ABSTRACT

A system and method of providing, assembling and maintaining floating rows and/or arrays of photovoltaic solar panels and terrestrial or elevated based rows and/or arrays of photovoltaic solar panels.

7 Claims, 11 Drawing Sheets

PHOTOVOLTAIC ARRAY SYSTEM AND METHOD

This application claims the benefit of U.S. Provisional Application No. 62/356,056 filed Jun. 29, 2016 entitled Photovoltaic Array System and Method.

BACKGROUND

Photovoltaic (PV) panels are widely used to convert solar energy to electrical power. A typical solar panel installation is comprised of a grid system employing one of many various types of structural products typically mounted on either rooftops or ground mounted applications using a variety of racking products. Over the past several years, there has been an increasing interest in being able to float solar panels over water and use what would have been otherwise unusable space for the generation of solar electric power.

Existing floating solar systems employ a variety of floating docking systems or structures that solar panels can be mounted to that will keep them above the water. The systems include mounting/docking structures intended to allow maintenance personnel access along floating docks, walkways, or other access paths adjacent to individual solar panels. Currently no system or method exists that will allow for solar panels to be floated independent of such attached or integrated access pathways and/or without using expensive metal-based solutions, obviously excepting the panel wiring and related electrical connections and equipment.

BRIEF DESCRIPTION OF DRAWINGS

The accompanying drawings, which are incorporated in and constitute a part of the specification, illustrate various example systems, methods, and so on that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

FIG. 7 is a perspective view of an embodiment where tubs may be stacked or nested for storage, shipment and the like.

DETAILED DESCRIPTION

Figure 1:
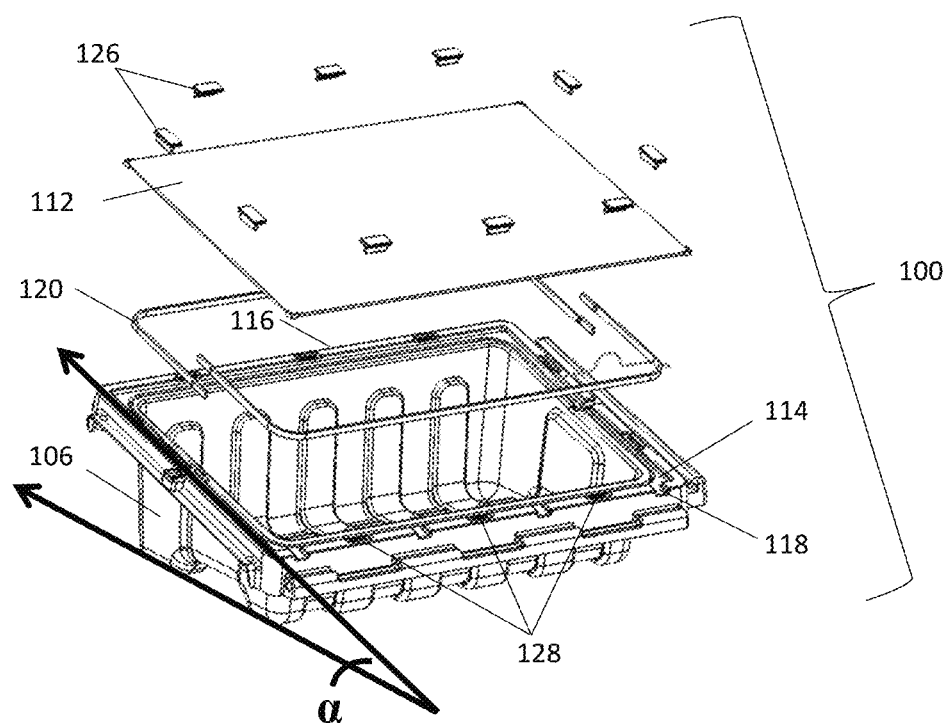
FIG. 1 is a simplified exploded view of a photovoltaic module, according to one aspect of the disclosure.

There are several related aspects of this disclosure. Generally, one aspect concerns modular, reconfigurable, floating photovoltaic systems, assemblies and methods. In connection with the floating aspects, another aspect concerns a maintenance vessel as part of such a system, assembly and method. Yet other aspects concern modular, reconfigurable, ground based photovoltaic systems, assemblies and methods.

The disclosure can be understood more readily by reference to the following detailed description, examples, and claims, and their previous and following description. Before the present system, devices, and/or methods are disclosed and described, it is to be understood that the invention is not limited to the specific systems, devices, and/or methods disclosed, as such can, of course, vary. It is also to be understood that the terminology used herein is for the purpose of describing particular aspects only and is not intended to be limiting.

The following description is provided as an enabling teaching of the invention in its best, currently known aspect. Those skilled in the relevant art will recognize that many changes can be made to the aspects described, while still obtaining the beneficial results shown and described. It will also be apparent that some of the desired benefits can be obtained by selecting some of the features without utilizing other features. Accordingly, those who work in the art will recognize that many modifications and adaptations are possible and can even be desirable in certain circumstances and are a part of the present disclosure. Thus, the following description is provided as illustrative of certain principles and not in limitation thereof.

As used herein, the singular forms "a," "an" and "the" include plural referents unless the context clearly dictates otherwise. Thus, for example, reference to an "orifice"

includes aspects having two or more orifices unless the context clearly indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Terms used herein, such as "exemplary" or "exemplified," are not meant to show preference, but rather to explain that the aspect discussed thereafter is merely one example of the aspect presented.

Additionally, as used herein, relative terms, such as "substantially", "generally", "approximately", and the like, are utilized herein to represent an inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

As used herein, "connection" or "connected" means both directly, that is, without other intervening elements or components, and indirectly, that is, with another component or components arranged between the items identified or described as being connected. To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the claims (e.g., A or B) it is intended to mean "A or B or both." When the applicants intend to indicate "only A or B but not both" then the term "only A or B but not both" will be employed. Similarly, when the applicants intend to indicate "one and only one" of A, B or C, the applicants will employ the phrase "one and only one." Thus, use of the term "or" herein is the inclusive, and not the exclusive use. See, Bryan A. Garner, A Dictionary of Modern Legal Usage 624 (2d. Ed. 1995). To the extent that the phrase "one or more of A, B and C" is employed herein, (e.g., storage for one or more of A, B and C) it is intended to convey the set of possibilities A, B, C, AB, AC, BC, and/or ABC (e.g., the storage may store only A, only B, only C, A&B, A&C, B&C, and/or A&B&C). It is not intended to require one of A, one of B, and one of C. When the applicants intend to indicate "at least one of A, at least one of B, and at least one of C," then the phrasing "at least one of A, at least one of B, and at least one of C" will be employed.

With reference now to FIG. 1, illustrating but one example of a photovoltaic array system and method 100, an exemplary floating base assembly or tub 106 allows a solar panel 112 to be maintained on a water environment (not shown) or optionally on a ground, roof or structure attached environment at a fixed tilt angle α. In the illustrated embodiment, the tub 106 includes a channel 114 approximating a circumference of a top 116 of the tub 106 with at least one drain 118 allowing escape of water, dust and the like from the channel 114 and system 100. A resilient, water resistant gasket 120 or sealing material fits snugly within the channel 114 and supports solar panel 112 in the channel. Removable clips 126 or other retention devices lock into indentations 128 adjacent to the channel 114 and connect the solar panel 112 to the tub 106. While a rectangular tub is illustrated, it is to be appreciated that alternately shaped tops, bottoms and sides, such as curved, cylindrical, oval, square, etc. may be similarly employed without departing from the concepts described herein. Specifically, rounded or other shaped bottoms may permit a user or installer to vary the tilt angle α to that desirable for the location or season or time of day. Similarly, tub 106 may be fitted with interior ballast chambers (not shown) that may be selectively be weighted or flooded to set a desired tilt angle.

Figure 2:
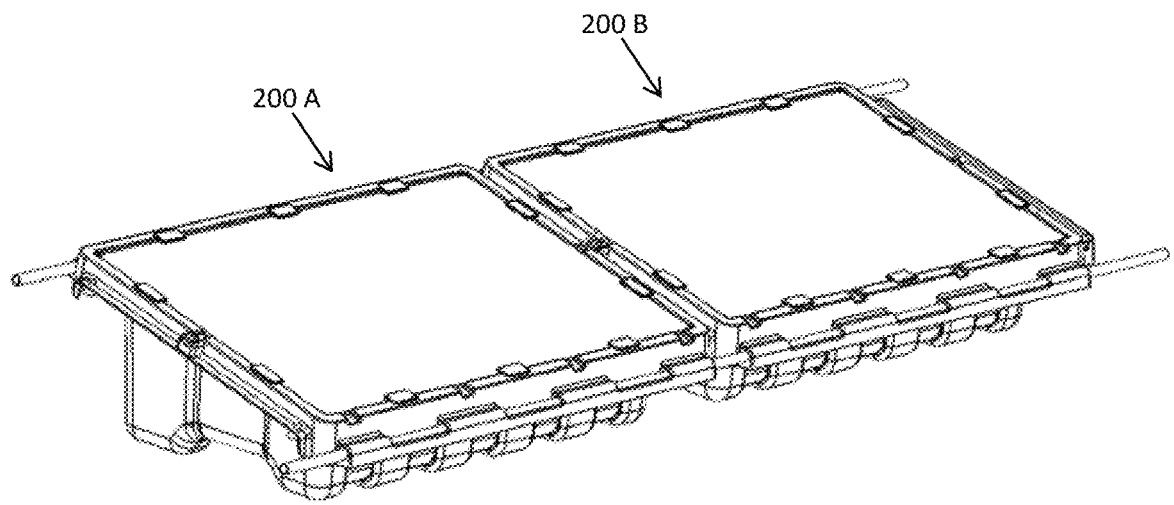
FIG. 2 is a simplified schematic view of an assembly of two photovoltaic modules, according to an aspect of the disclosure.

With reference now to FIG. 2, individual modules 200 A, 200 B, and so on may be connected in a variety of configurations to form connected parallel rows forming a floating photovoltaic array or system.

Figure 3:
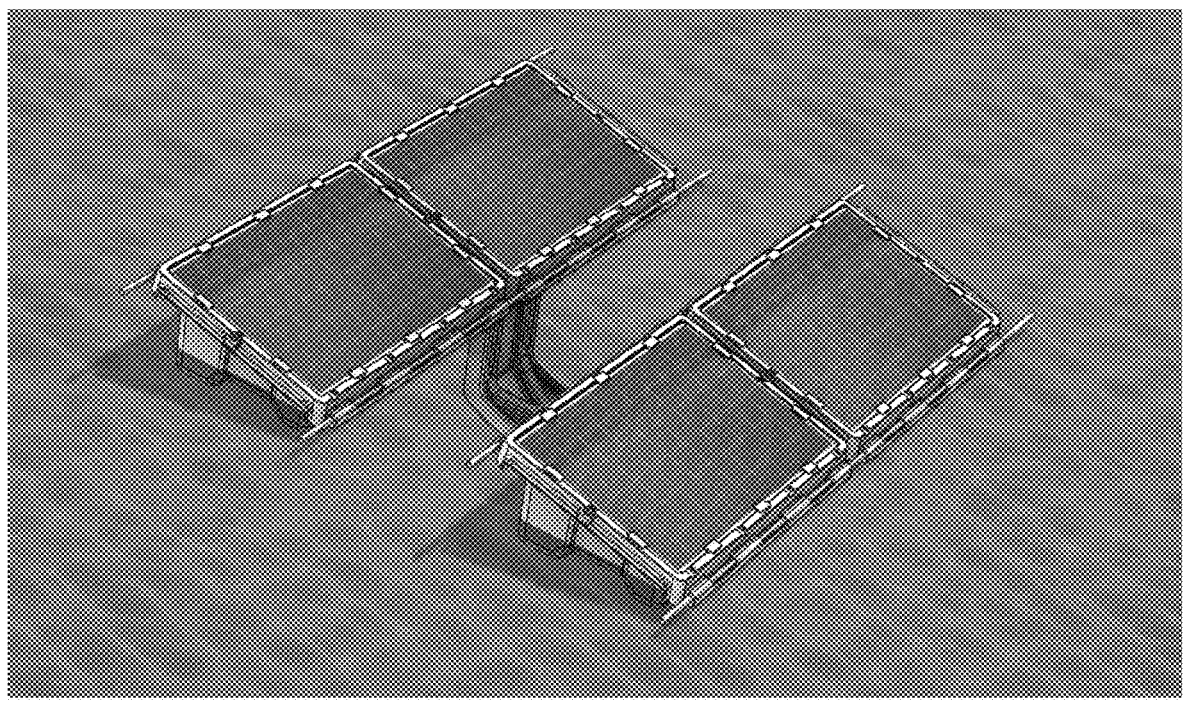
FIG. 3 is a simplified schematic view of an assembly of four photovoltaic modules, according to an aspect of the disclosure.

With reference now to FIG. 3, a sample two row system is illustrated where each row includes two floating tub/panel assemblies connected by a channel forming linkage.

Figure 4:
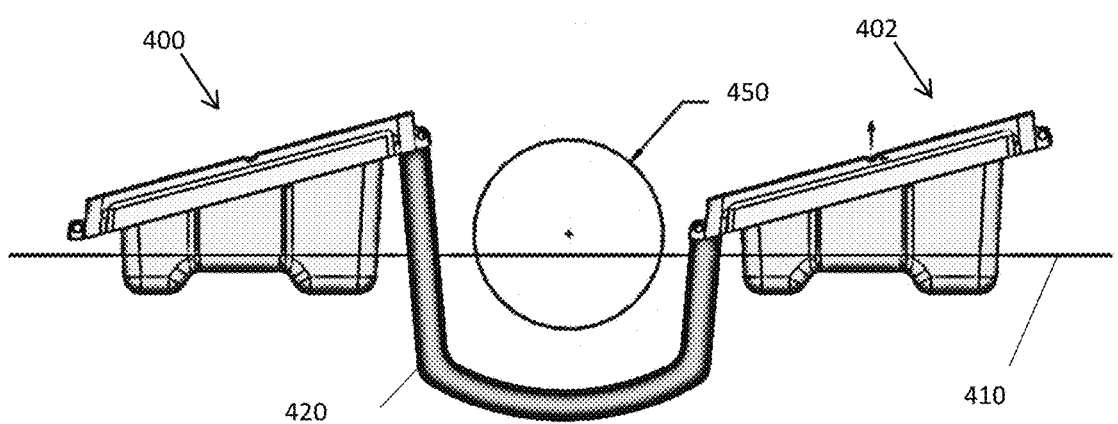
FIG. 4 is a side view of an assembly of photovoltaic modules, according to an aspect of the disclosure.

With reference now to FIG. 4, a side view shows example parallel rows of a photovoltaic system including a first row 400 and a second row 402 floating in a water environment 410. A submerged linkage 420 connects modules or rows of modules 400, 402 electrically, mechanically or both and creates space between the rows of panels. In some embodiments a linkage may connect variably tilting tubs. In one embodiment, the linkage 420 creates separation suitable to accommodate a pontoon 450 which may, for example, comprise one supporting pontoon for a maintenance deck that may travel along parallel rows for cleaning, maintenance, and the like, and for example, as further discussed below. In an embodiment, the linkage 420 is configured as a channel forming linkage where the channel provides the access for the pontoon deck or an access for other floating conveyances to maintain, install, clean or otherwise service the system. In one embodiment, the linkage 420 is rigid maintaining relative position of the rows, in other embodiments the linkage accommodates relative movement of the rows.

Figure 5:
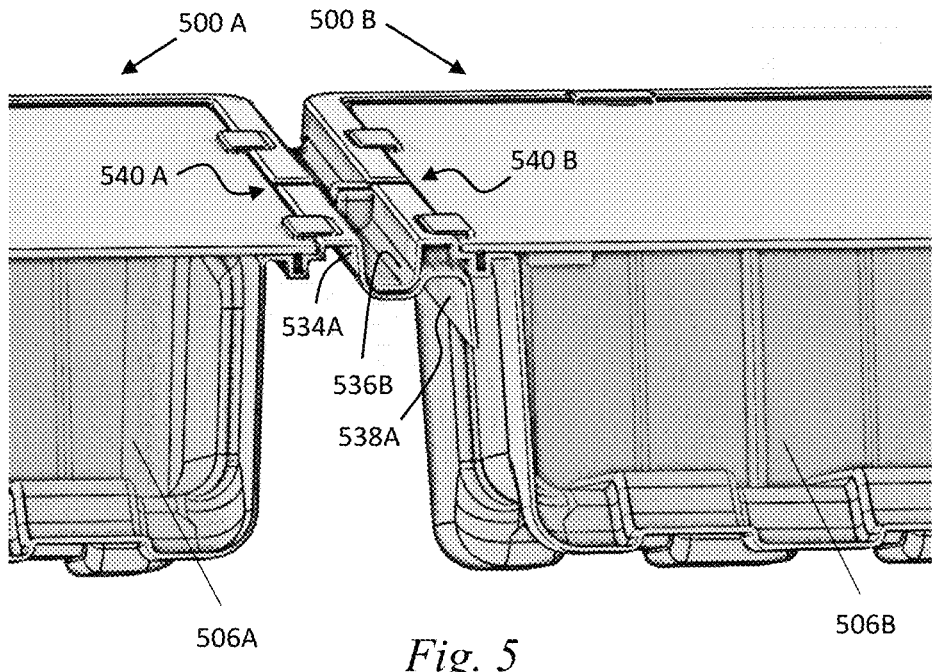
FIG. 5 is a cross-sectional view illustrating a connection between photovoltaic modules, according to an aspect of the disclosure.

With reference now to FIG. 5, a cross-sectional view of partial row of modules 500 A, 500 B each include opposed, complementary interlock elements 534 A and 536 B respectively. In the illustrated exemplary embodiment, interlock element 534 A extends from module 500 A and forms a channel to receive complementary shaped interlock element 536 B. Interlock element 534 A further extends and terminates in tub spacer 538 A which may facilitate a user assembling a row of tubs 506 and act to prevent or discourage lateral movement in a row of array modules 500.

Figure 6:
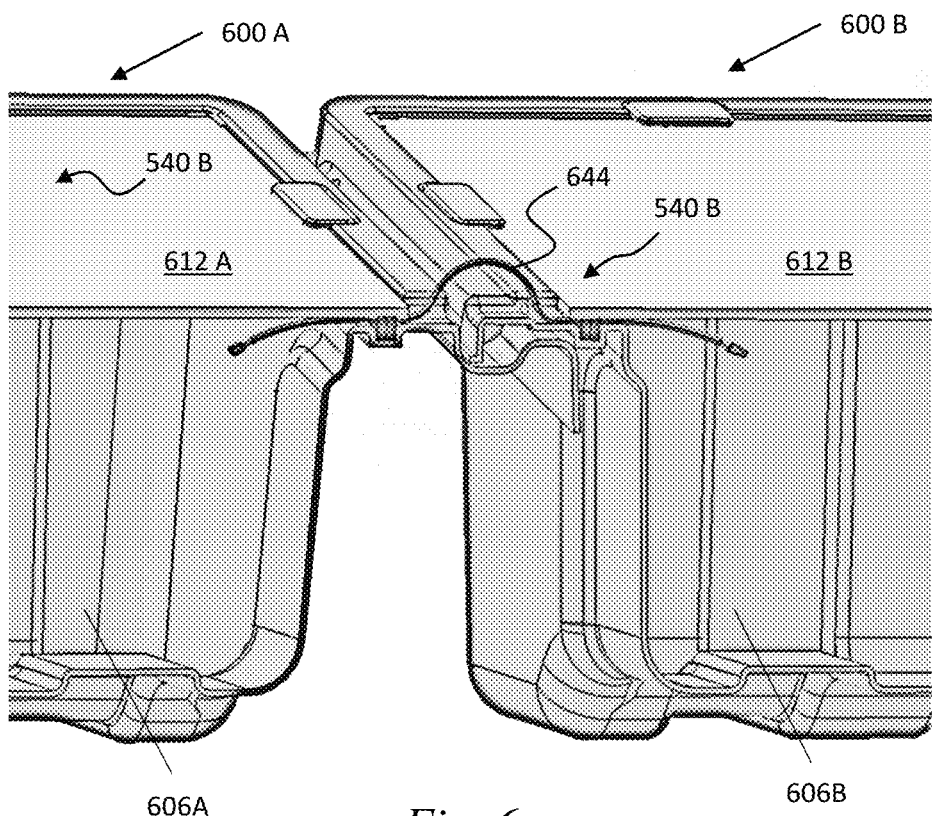
FIG. 6 is a cross-sectional view illustrating a connection between photovoltaic modules, according to an aspect of the disclosure.

With reference now to FIG. 6, array modules 600 A, 600 B may additionally comprise an interconnect channel 540 or other means for interconnecting a series of modules 600 in a row. Interconnect channel 540 may accommodate electrical, mechanical, or connectors 644 including either or both types. For example, electrical connector 644 may electrically connect photovoltaic panels 612. In one embodiment, the panels may be connected in electrical series and in another embodiment the panels may be connected electrically in parallel. In another example, mechanical connector 644 may mechanically connect tubs 606. either loosely as illustrated or drawn tightly.

Figure 7:
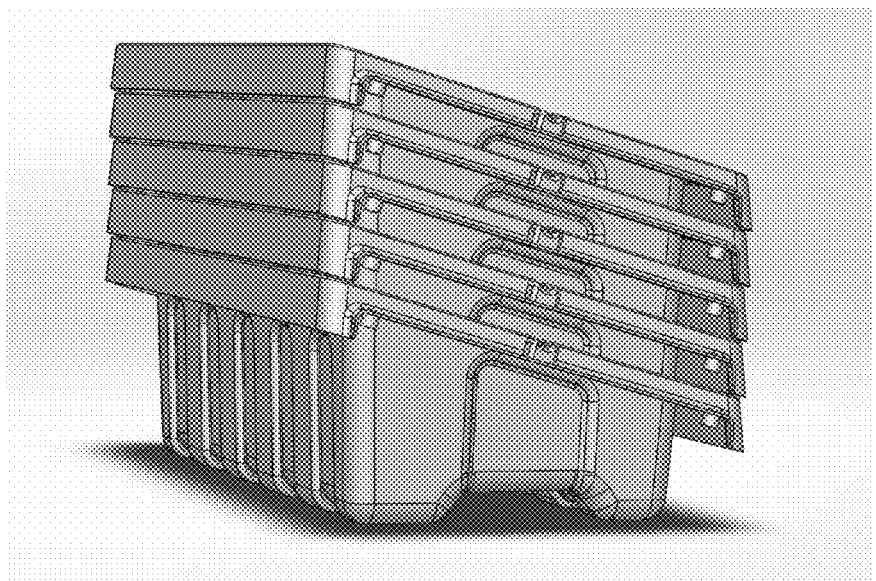
Figure 8:
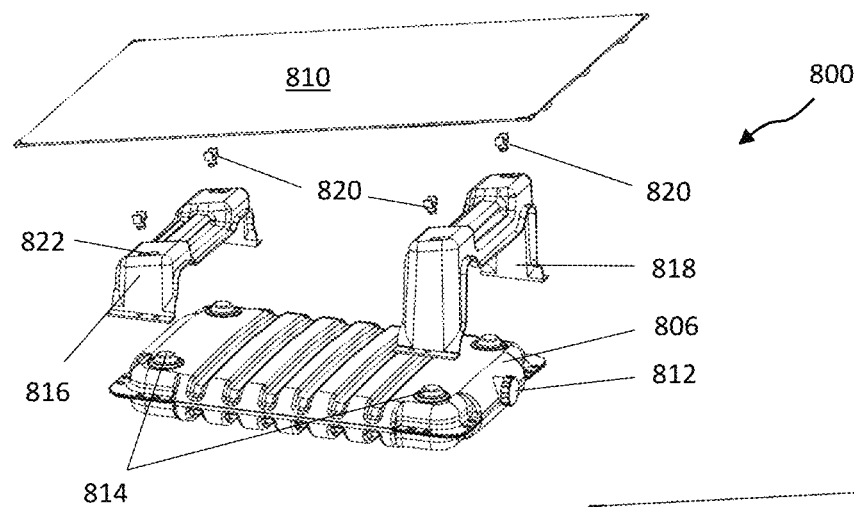
FIG. 8 is a simplified exploded view of a photovoltaic module, according to another aspect of the disclosure.
Figure 9:
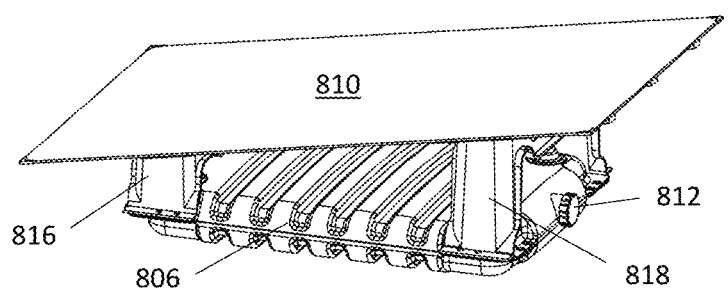
FIG. 9 is a perspective view of the module of FIG. 8 in an assembled state.
Figure 10:
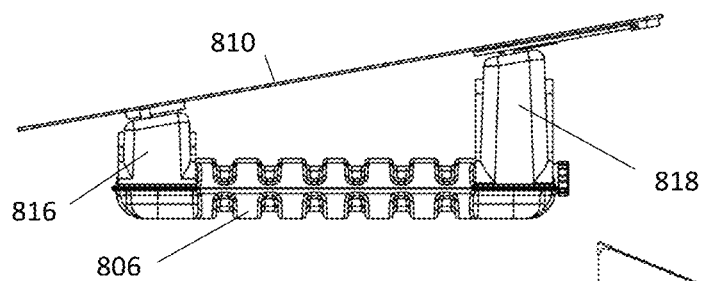
FIG. 10 is a side view of the module of FIG. 9.

With reference now to FIG. 7, base assembly tubs may be stacked or nested for storage, shipment and the like.

Figure 11:
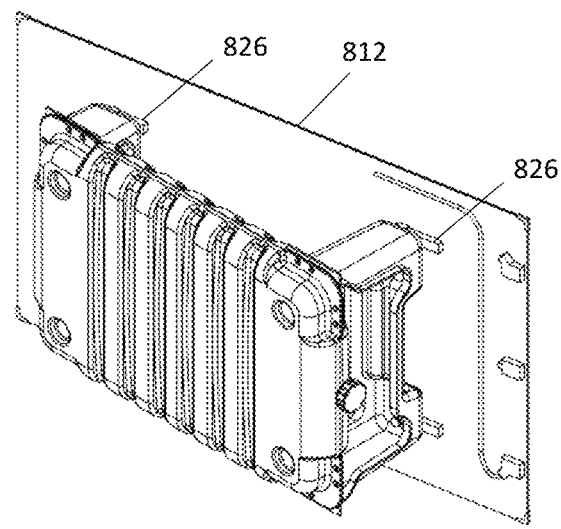
FIG. 11 is a bottom side perspective view of the module of FIG. 9.

With reference now to FIGS. 8-11, in another embodiment, a floating photovoltaic array system 800, includes a floating base assembly or tub 806 allowing a solar panel 810 to be maintained on a water environment (not shown) or optionally on a ground, roof or structure attached environment at a fixed angle. The tub defines an internal void or volume (not illustrated) to trap air and improve buoyancy or, alternately, the internal void may be filled with water, sand or other ballast for floating or terrestrial based uses. The void is accessible through an opening sealed by cap 812. In the illustrated embodiment, the tub 806 includes connectors 814 to connect struts 816, 818 to the tub. Connectors 814 may magnetically couple with struts 816, 818, or be screwed, glued, snapped, press fit or otherwise fixedly connect the struts 816, 818 to the tub 806. A number of adapters 820 are illustrated to connect the solar panel 810 to the struts 816, 818. In one embodiment, the adapters 820 are received by a key-hole slot 822 on a supporting side of the struts 816, 818 and are received on an opposing side by a connection point 826 on an underside of the solar panel 810 (FIG. 11). While a rectangular tub 806 is illustrated, it is to be appreciated that alternately shaped tops, bottoms and sides, such as curved, cylindrical, oval, square, etc. may be similarly employed without departing from the concepts described herein. Specifically, rounded or other shaped bottoms may permit a user or installer to vary the tilt angle to that desirable for the location or season or time of day. Similarly, tub 806 may be fitted with interior ballast chambers (not shown) that may be selectively be weighted or flooded to set a desired tilt angle.

Figure 12:
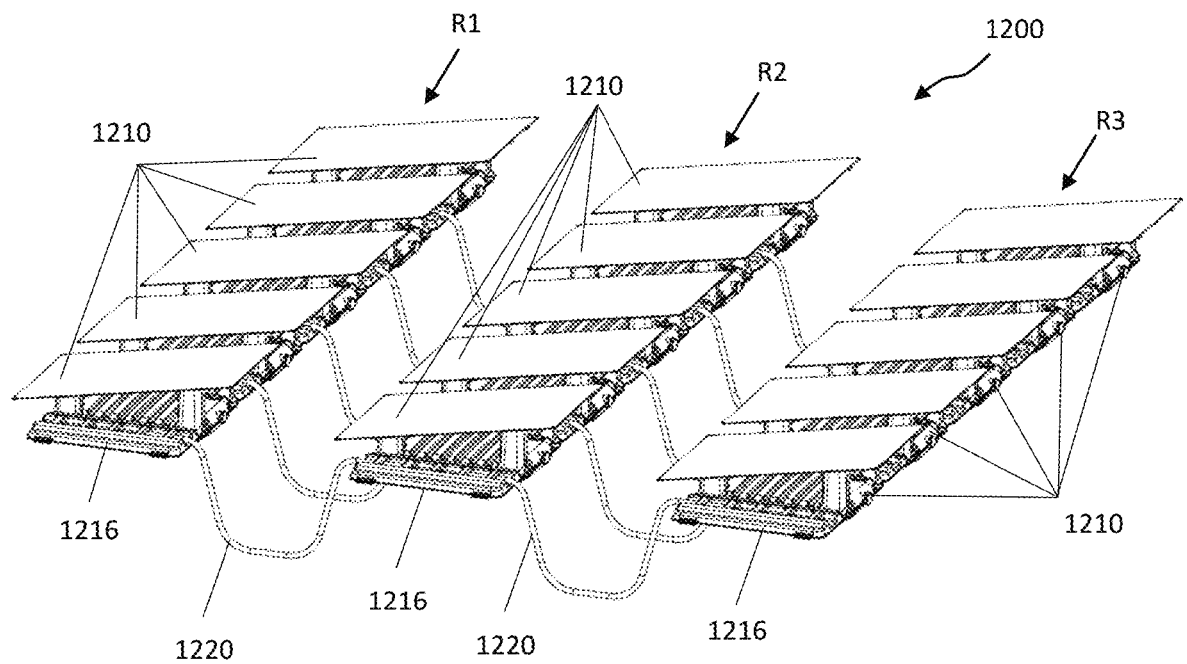
FIG. 12 is a perspective view of an array of modules including interconnected rows of modules.

With reference now to FIG. 12, a 3×5 array 1200 of interconnected modules 1210 are illustrated. The modules are each composed of a tub, strut, solar panel elements as described above, for example, in connection with FIGS. 8-11. The modules also each include a tub spacer 1216 mechanically connecting the base assemblies together to form rows R1, R2, R3 and so on. The modules also include a channel forming linkage 1220 mechanically connecting the rows R1, R2, R3 here illustrated as connecting via the spacers 1216 but other connection points on the modules 1210 may be substituted. The channel forming linkage 1220 extends from the module and deflects downward, here in a "U" shape, so as to be submerged before connecting to the other module in another row of base assemblies. The channel forming linkages 1220 maintain a spaced relationship between the rows R1, R2, R3 of buoyant base assemblies and provides a submerged depth sufficient to permit flotation travel, such as by pontoon boat, kayak or the like along a channel formed between the rows R1, R2, R3 of buoyant base assemblies. In an embodiment, the flotation travel mechanism may be used by users to maintain, clean and/or install additional modules 1210 or components thereof.

Figures 13A, 13B:
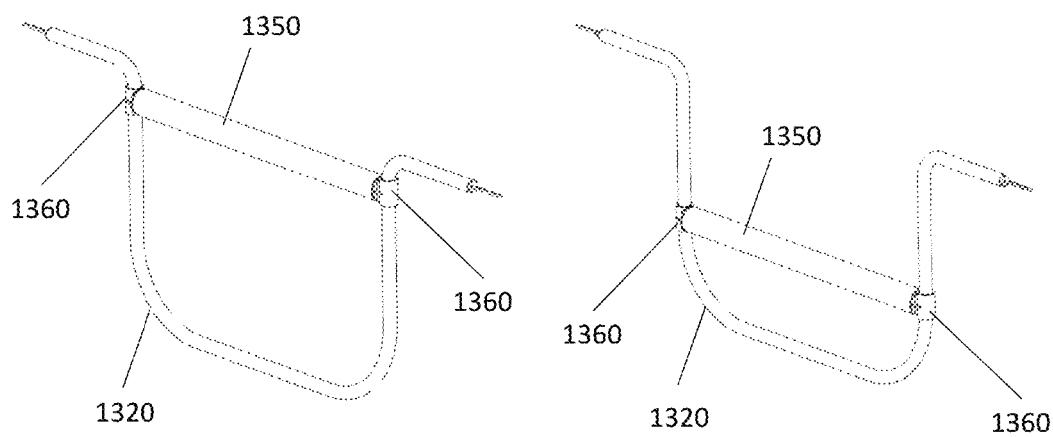
FIGS. 13A and 13B are perspective views of an alternate channel forming linkage in two configurations.

With reference now to FIGS. 13A and 13B, an alternate channel forming linkage 1320 includes a support brace 1350. The support brace 1350 may include eyes or connections 1360 to engage the support linkage 1320 while permitting the brace to travel along vertically oriented portions of the linkage 1320. The support brace 1350 is preferably buoyant or otherwise urged to allow a normal disposition at or near the top part of the linkage 1320. In this configuration, the support brace 1350 inhibits relative movement of the rows R1, R2, R3 of modules. In an alternate configuration, a maintenance platform or access platform (not shown but discussed below) in the channel, urges the support brace 1350 to a submerged configuration illustrated in FIG. 13B permitting passage of the platform. Once the platform no longer depresses the brace 1350 it returns to a position at or near the top part of the linkage 1320.

Referring to FIGS. 12 and 13, it can be appreciated that in some embodiments, linkage 1320 may not be required on every module in an array. Where linkage 1320 connects only certain modules, linkage 1220 connects other modules and no linkage connects other modules, or variations thereof.

Figure 14:
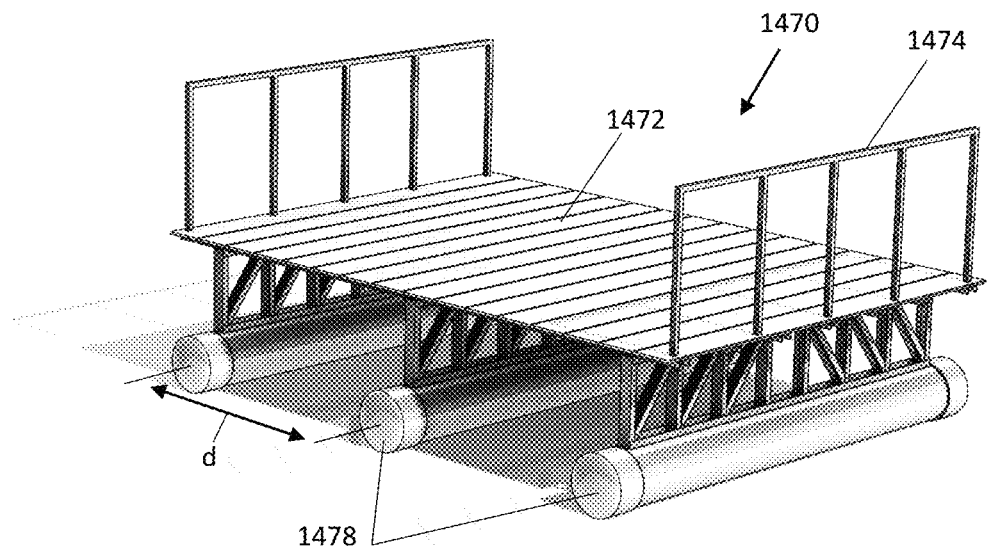
FIG. 14 is a perspective view of a maintenance platform for an assembly of photovoltaic modules, according to an aspect of the disclosure.

With reference now to FIG. 14 an exemplary floating maintenance platform 1470 is depicted. Example platform 1470 includes a deck 1472 and at least one railing 1474. The deck 1472 may be supported directly or indirectly by a plurality of pontoons 1478 separated by a consistent distance, d Distance d is preferably selected based on linkage separation distance between successive rows or multiples of rows (i.e. every other row rather than every row) or modules.

Figure 15:
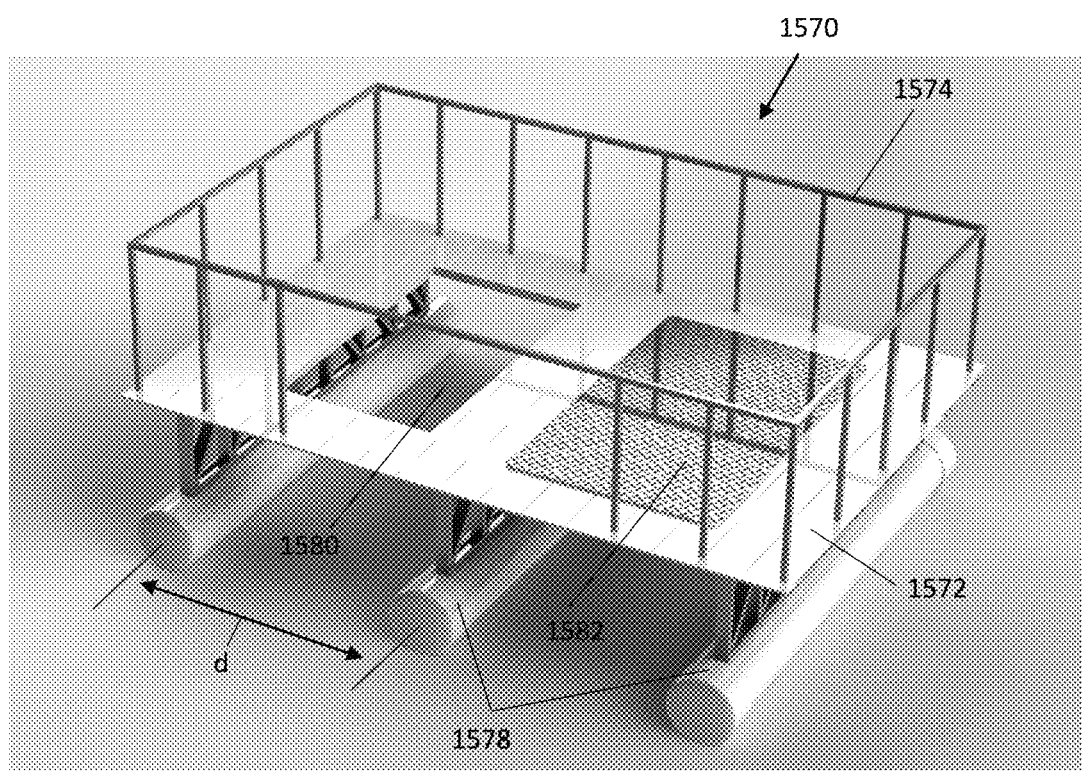
FIG. 15 is a perspective view of an alternate maintenance platform for an assembly of photovoltaic modules, according to an aspect of the disclosure.

With reference now to FIG. 15, another exemplary floating maintenance platform 1570 is depicted. Example platform 1570 includes a deck 1572 and at least one railing 1574. The deck 1572 may be supported directly or indirectly by a plurality of pontoons 1578 separated by a consistent distance, d Deck may include an opening 1580 through which users may access modules for maintenance, cleaning, replacement, installation and the like. The deck may further include an opening cover 1582 to cover one or all of the openings 1580 as desired.

Additionally, floating maintenance platform may be powered or manually positioned along a photovoltaic array. For example, at least one pontoon may be configured with a motor (not shown).

Figure 16:
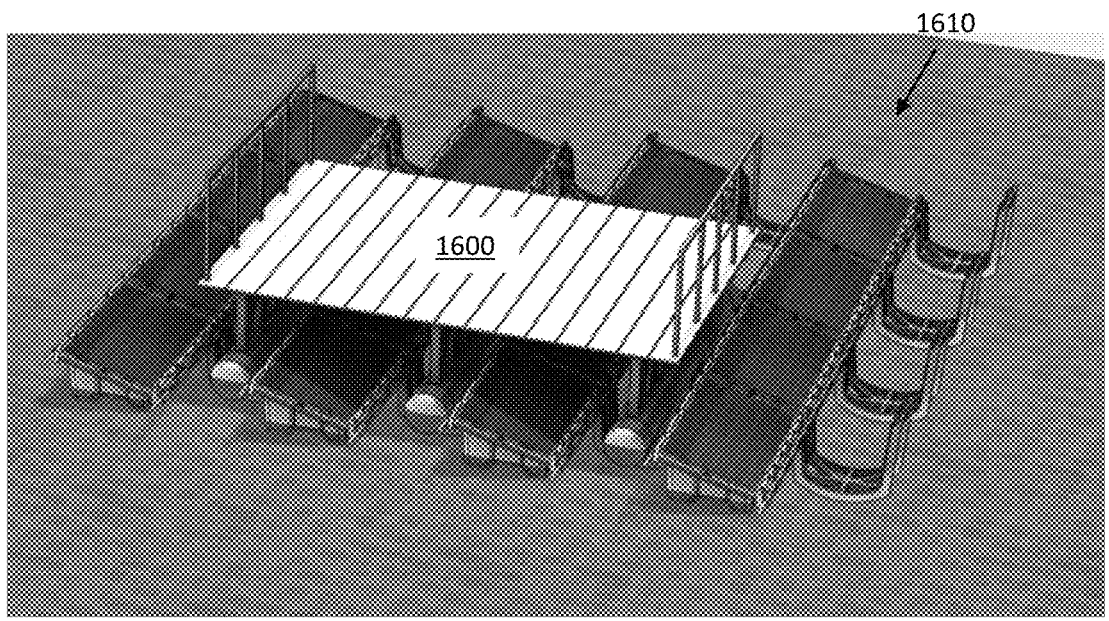
FIG. 16 is a perspective view of an exemplary platform over an array of interconnected modules.
Figure 17:
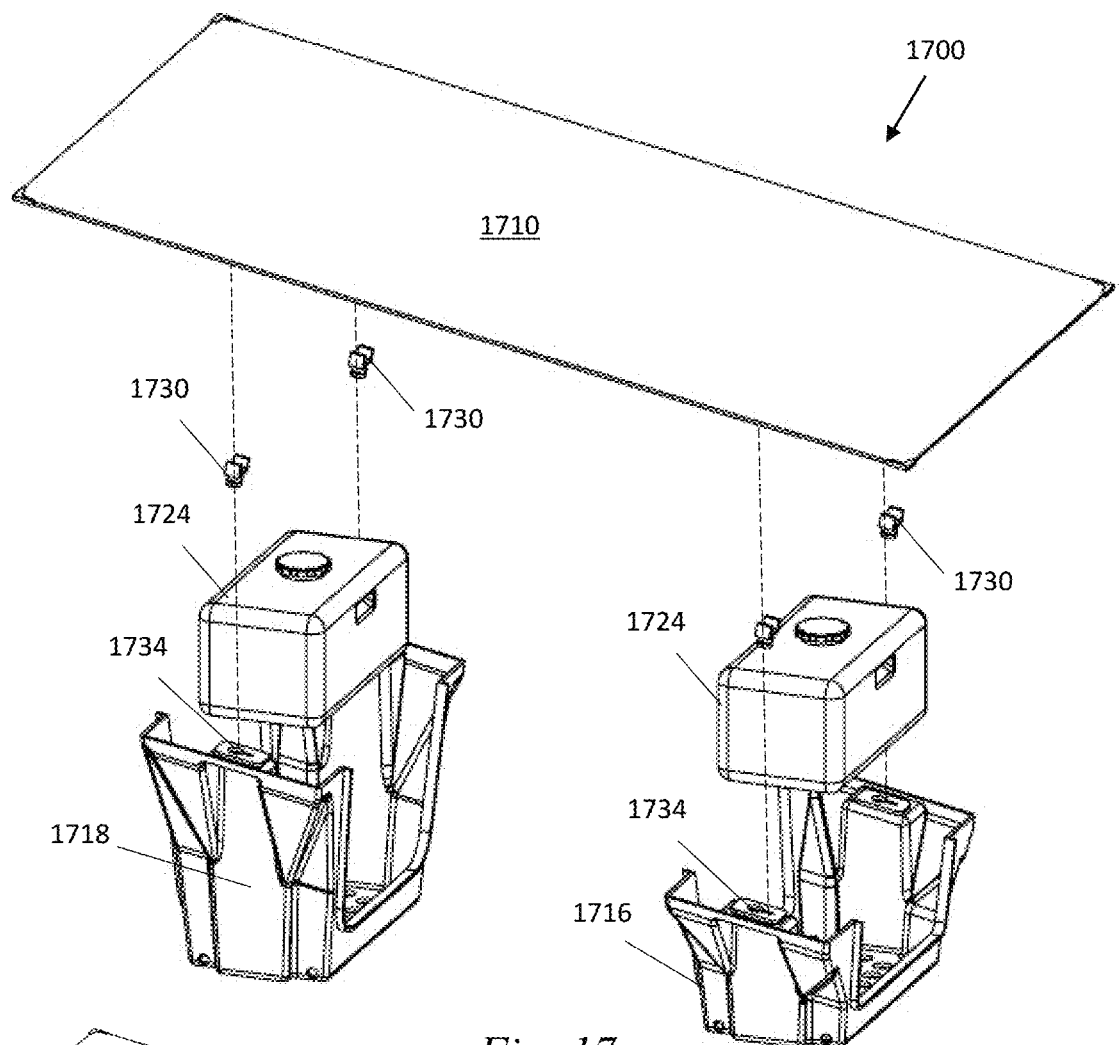
FIG. 17 is a simplified exploded view of a photovoltaic module, according to another aspect of the disclosure.
Figure 18:
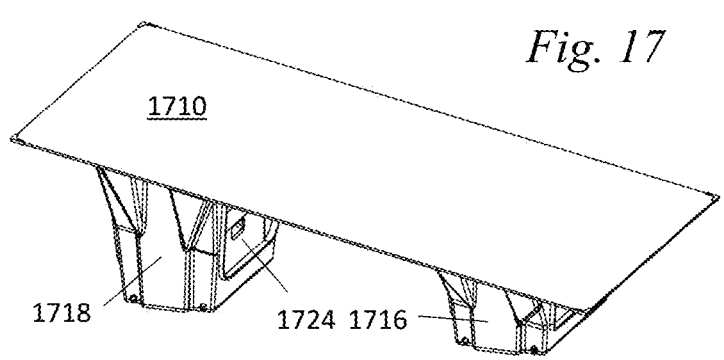
FIG. 18 is a perspective view of the module of FIG. 17 in an assembled state.
Figure 19:
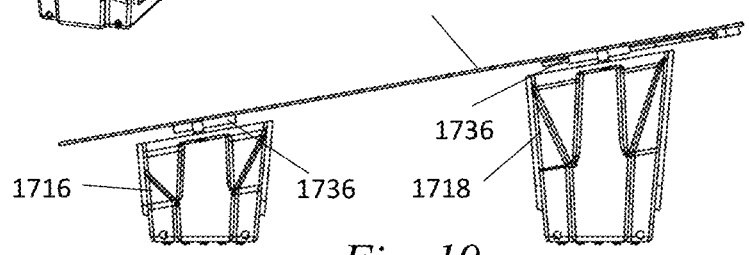
FIG. 19 is a side view of the module of FIG. 17.
Figure 20:
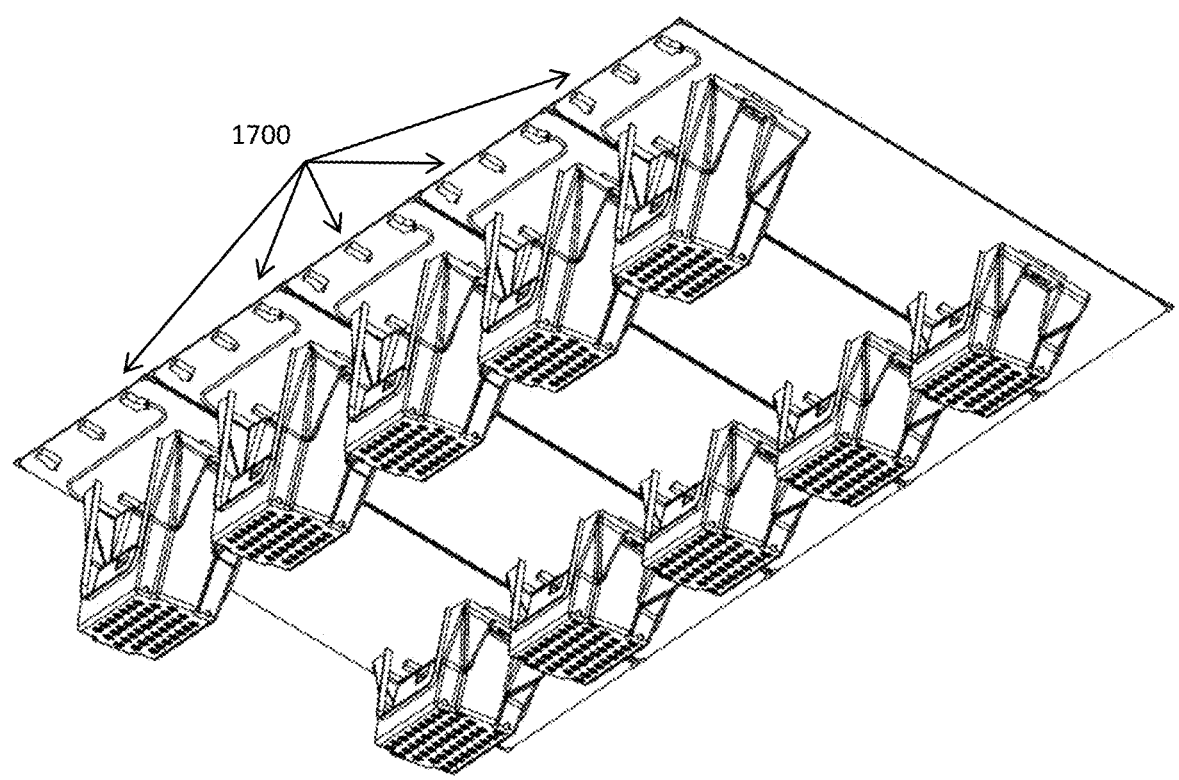
FIG. 20 is a bottom side perspective view of a row of modules.

With reference now to FIG. 16, an exemplary platform 1600 is shown over an array 1610 of connected modules or floating tub/panel assemblies.

With reference now to FIGS. 17-20, in another embodiment, a module 1700 configured as a ground based or attachable, for example, to a structure, includes a photovoltaic panel 1710. The panel 1710 attaches to struts 1716, 1718, optionally configured to contain ballast containers 1724 defining an interior volume or void (not illustrated) to be filled with water, sand or other ballast for terrestrial or uses when the struts are unconnected to a structure. The void is accessible through an opening sealed by a cap. A number of adapters 1730 are illustrated to connect the solar panel 1710 to the struts 1716, 1718. In one embodiment, the adapters 1730 are received by a key-hole slot 1734 on a supporting side of the struts 1716, 1718 and are received on an opposing side by a connection point 1736 on an underside of the solar panel 1710. While rectangular atruts 1716, 1718 are illustrated, it is to be appreciated that alternately shaped tops, bottoms and sides, such as curved, cylindrical, oval, square, etc. may be similarly employed without departing from the concepts described herein. Specifically, rounded or other shaped bottoms may permit a user or installer to vary the tilt angle to that desirable for the location or season or time of day. Alternatively, varying height struts may connect to uniformly sized and height base structures, and in some embodiments, those uniformly size structures contain the ballast containers if in use.

Figures 21, 22:
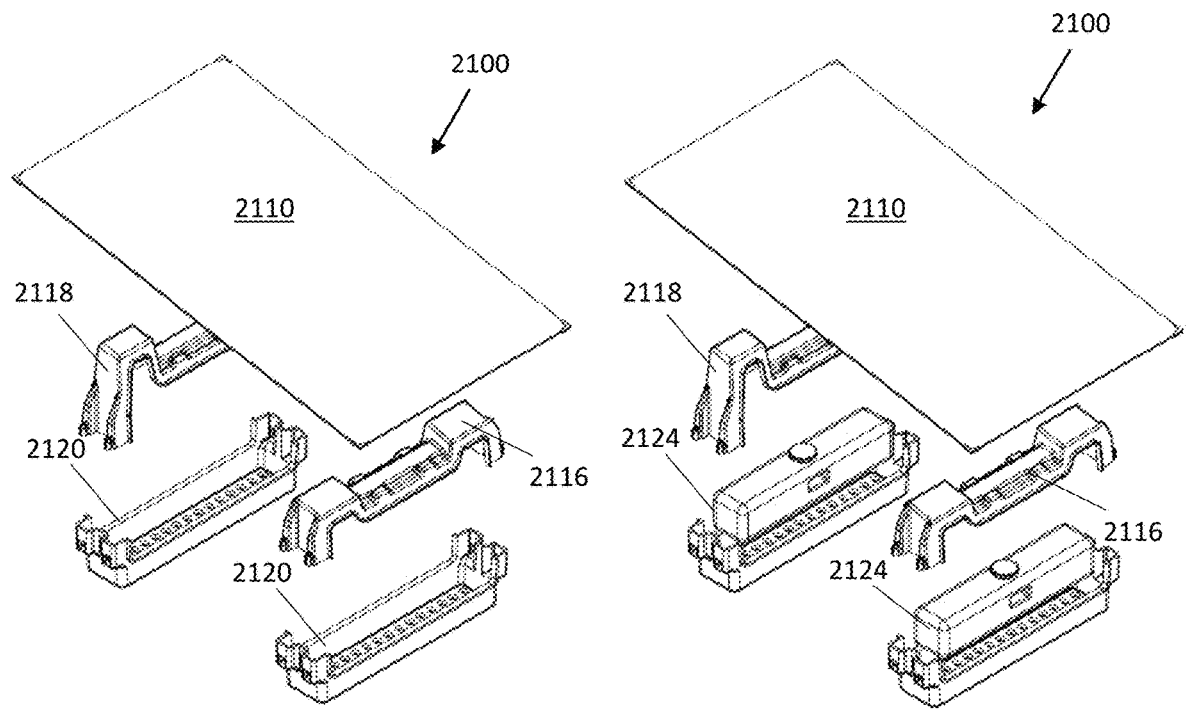
FIG. 21 is a simplified exploded view of a photovoltaic module, according to another aspect of the disclosure.
FIG. 22 is a simplified exploded view of a photovoltaic module, according to another aspect of the disclosure.
Figure 23:
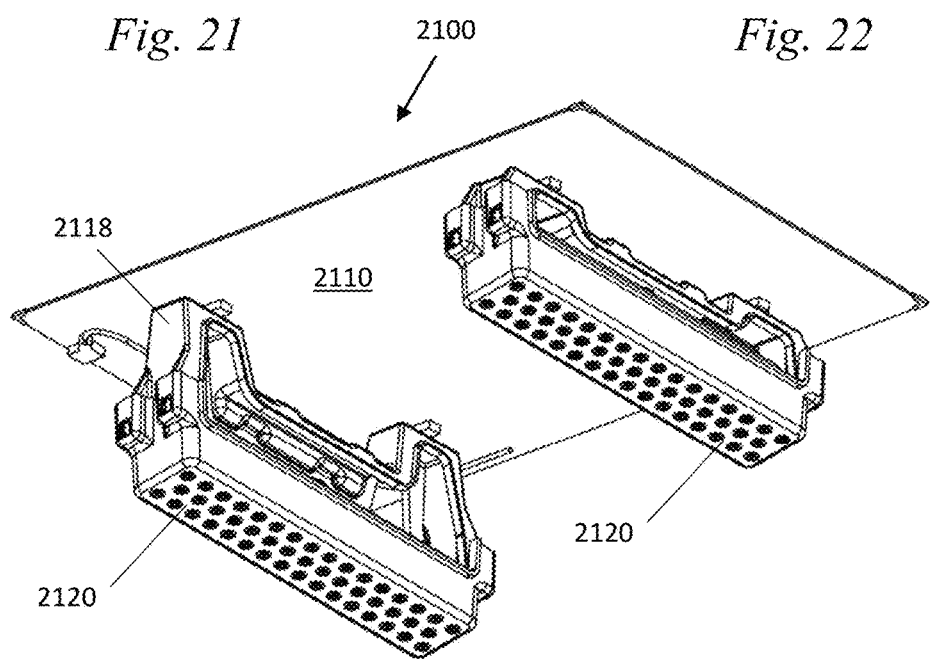
FIG. 23 is a bottom side perspective view of the module of FIG. 21 or 22.

With reference now to FIGS. 21-23 in another embodiment, a module 2100 configured as a ground based system or as part of an array or attachable, for example, to a structure, includes a photovoltaic panel 2110. The panel 2110 attaches to varying height struts 2116, 2118. Varying height struts 2116, 2118 connect to bases 2120 that may optionally contain ballast containers 2124. Other aspects of mechanical connection to photovoltaic panel 2110, electrical connections, and shape options and the like, are similar to those discussed above.

Although several aspects have been disclosed in the foregoing specification, it is understood by those skilled in the art that many modifications and other aspects will come to mind to artisans having the benefit of the teaching presented in the foregoing description and associated drawings. It is thus understood that the invention is not limited to the specific aspects disclosed hereinabove, and that many modifications and other aspects are intended to be included within the scope of the appended claims. Moreover, although specific terms are employed herein, as well as in the claims that follow, they are used only in a generic and descriptive sense, and are not intended as limiting.

What is claimed is:

1. A floating photovoltaic panel support and maintenance system for a body of water, the system comprising:
   a plurality photovoltaic panels;
   a plurality of buoyant base assemblies each including connectors for mechanically connecting one of the plurality of photovoltaic panels to the buoyant base assembly;
   a plurality of spacers mechanically connecting adjacent buoyant base assemblies to form a first row of buoyant base assemblies;
   a plurality of channel forming linkages each mechanically connecting the first row of buoyant base assemblies to a second row of buoyant base assemblies, where each channel forming linkage includes a first vertically oriented arm connected to the first row of buoyant base assemblies and deflecting downward to a submerged end, and where each channel forming linkage includes a second vertically oriented arm connected to the second row of buoyant base assemblies and deflecting downward to a submerged end connected to the submerged end of the first vertically oriented arm, and where each channel forming linkage includes a support brace movable along the arms between an upper position near the buoyant base assemblies and a lower position toward the submerged ends of the first and second arms, where the support brace maintains the first and second arms in a consistent separation and maintains a channel between the first row of buoyant base assemblies and the second row of buoyant base assemblies when the support brace is in the upper position; and
   a maintenance vessel having a floatation hull with curved opposed ends, where when the maintenance vessel travels the channel the floatation hull rides over the support brace and temporarily urges the support brace toward the lower position.

2. The photovoltaic panel support and maintenance system as set forth in claim 1, where the maintenance vessel comprises an essentially level platform connected to the flotation hull, where the platform is at a height sufficiently high to clear photovoltaic panels connected to the buoyant base assemblies and a height sufficiently low to permit user access from the platform to the photovoltaic panels connected to the buoyant base assemblies.

3. The photovoltaic panel support and maintenance system as set forth in claim 1, where the connectors comprise a support strut to orient at least one of the plurality photovoltaic panels at an angle relative to the body of water.

4. The photovoltaic panel support and maintenance system as set forth in claim 1, where the connectors comprise a first support strut connected on a first side of one of the plurality or buoyant base assemblies and a second support strut connected on a second side of the one of the plurality of buoyant base assemblies opposite of the first side, and where the second support strut has a different height than the first support strut.

5. The photovoltaic panel support and maintenance system as set forth in claim 4, where the first support strut and the second support strut support at least one of the plurality of photovoltaic panels and permit airflow between a bottom side of the at least one of the plurality of photovoltaic panels and a top side of the one of the plurality of buoyant base assemblies.

6. The photovoltaic panel support and maintenance system as set forth in claim 1, further comprising each of the plurality of photovoltaic panels mechanically connected to a separate one of the plurality buoyant base assemblies.

7. The photovoltaic panel support and maintenance system as set forth in claim 6, further comprising the plurality of photovoltaic panels electrically connected together.

* * * * *